United States Patent [19]

Calderara

[11] 4,148,530
[45] Apr. 10, 1979

[54] CUT ANGLES FOR PIEZOELECTRIC QUARTZ CRYSTAL ELEMENTS

[75] Inventor: Reto Calderara, Bern, Switzerland

[73] Assignee: Kistler Instrumente AG, Switzerland

[21] Appl. No.: 805,468

[22] Filed: Jun. 10, 1977

Related U.S. Application Data

[63] Continuation of Ser. No. 234,702, Mar. 15, 1972, abandoned.

[30] Foreign Application Priority Data

Mar. 15, 1971 [CH] Switzerland ............... 3757/71

[51] Int. Cl.² ........................... H01L 41/18
[52] U.S. Cl. .................................. 310/361
[58] Field of Search .................... 310/360-362

[56] References Cited

U.S. PATENT DOCUMENTS

| | | | |
|---|---|---|---|
| 2,173,589 | 9/1939 | Mason et al. | 310/361 |
| 2,212,139 | 8/1940 | Baldwin et al. | 310/361 |
| 2,277,245 | 3/1942 | Mason | 310/361 |
| 2,743,144 | 4/1956 | Bottom et al. | 310/361 |
| 3,072,806 | 1/1963 | Sogn | 310/361 |
| 3,423,609 | 1/1969 | Hammond | 310/361 |

OTHER PUBLICATIONS

*Handbook of Piezoelectric Materials*, J. P. Buchanan, Philco Co., Dec. 1954.
*Piezoelectricity*, Cady, Dover Publications, N. Y., revised 1964, pp. 134–156.

*Primary Examiner*—Mark O. Budd
*Attorney, Agent, or Firm*—Craig & Antonelli

[57] ABSTRACT

A piezoelectric crystal element comprising a member of monocrystalline material of symmetry class 32 has two force introduction surfaces essentially parallel to a crystallographic 'a'-axis but inclined with respect to the 'c'-axis so as to intersect the latter at a specific angle e.g. 10° to 40° to considerably reduce over a desired temperature range the temperature dependence of transverse of antiaxial shear sensitivity.

10 Claims, 10 Drawing Figures

Inventor:

Inventor:

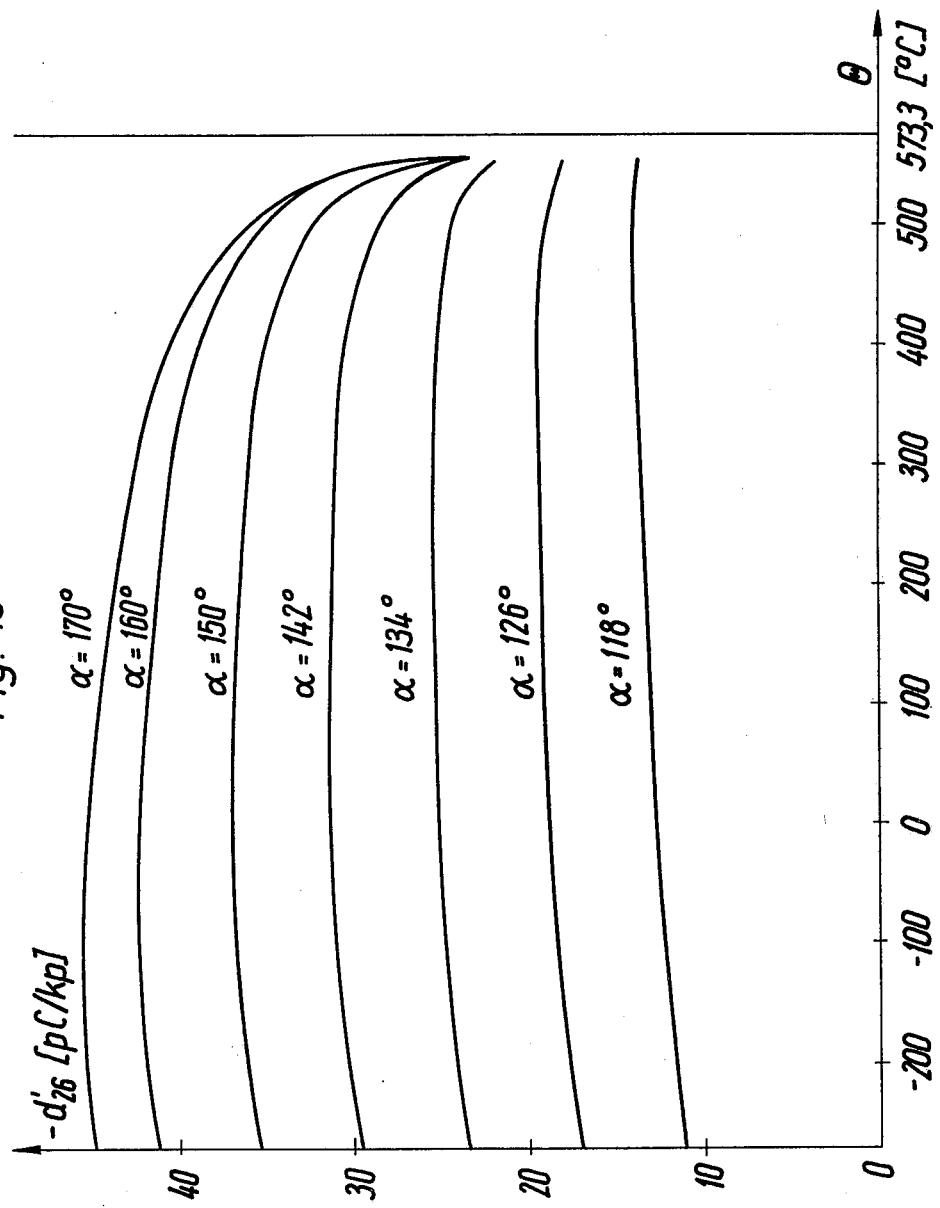

CUT ANGLES FOR PIEZOELECTRIC QUARTZ CRYSTAL ELEMENTS

This application is a continuation application of my copending application Ser. No. 234,702 filed Mar. 15, 1972, now abandoned.

It is known that piezoelectric measuring technology has developed into one of the most accurate and universal methods of analyzing dynamic force and pressure processes, accelerations and vibration states. Piezoelectric measuring transducers are distinguished from other measuring elements in particular by their very high resonant frequency, extreme rigidity and small dimensions. This enables virtually translationless measurements to be made within minimum reaction on the object being measured, together with the simultaneous resolution of more than one vector component. There is the unique facility of being able to apply compensation with static preloads exceeding a measured value by many orders of magnitude when measuring force, shear and pressure, without affecting precision. Further advantages of piezoelectric measuring techniques are the outstanding linearity and lack of hysteresis over measuring ranges which may extend over several orders of magnitude.

The active elements of piezoelectric precision measuring cells consist very often of quartz crystals, because this material is predestined for such applications thanks to its excellent mechanical and electrical properties. Although many ferroelectric substances with much greater piezoelectric effects are available as transducer materials, at the present time these do not appear to be capable of providing substitutes for quartz in applications where high precision is demanded, due to their inadequate long-time stability and inherent hysteresis.

With the development of high-temperature-resistant materials for gas turbine, nuclear and rocket engineering, a number of problems have arisen with respect to piezoelectric measuring technology, requiring measuring cells able of operating reliably over temperature intervals exceeding 400° C. For such uses the effect of the temperature-dependence of the piezoelectric sensitivity of quartz is particularly troublesome. Moreover, in view of the present trend favoring rationally calibrated measuring chains the temperature effect presents a major complication. The piezoelectric charge coefficient $d_{11}$, on which the sensitivity of contemporary longitudinal, transverse and shear transducer elements depends, diminishes by 4.54% between 0 and 200° C. for example, and by 9.12% between 200 and 400° C. As may be seen from FIG. 5, the sensitivity drops increasingly at still higher temperatures, finally reaching zero at the high-low transformation point of quartz (573.3° C.). For this reason the use of transducers with the usual quartz elements is mostly confined to a relatively narrow temperature range.

Devices employed to eliminate the influences of temperature on the measured result in designs known hitherto were concerned, as a rule, only with compensating pseudo-pyroelecticity, in other words, compensating the differential thermal expansion between the crystal assembly and the transducer housing or preloading system as the case might be. For this, the crystal assembly is shimmed with compensating discs of non-piezoelectric materials having a higher coefficient of expansion than the quartz elements. These familiar configurations are, however, inevitably incapable of compensating deviations in the sensitivity of the crystal elements due to the temperature-dependence of the piezoelectric coefficient.

Proposals have been made for compensating this temperature-dependence by electronic means. For this purpose a thermocouple, thermistor or other temperature-dependent component is incorporated in the transducer and linked with the charge amplifier, whose gain it controls, via a measuring amplifier followed by a function converter. Secondary compensation systems of this kind have not found acceptance in practice, because they entail a number of serious disadvantages, such as the increased dimensions of the measuring cell owing to the temperature-dependent component and its connections, the complication of additional electrical conductors, the problems associated with charge amplifiers controlled through a function converter, negative feedback preventing full utilization of the precision of the piezoelectric transducer elements, etc.

The invention forming the subject of this application serves the purpose of providing piezoelectric crystal elements in which the temperature-dependence of the piezoelectric sensitivity can be adapted to requirements by selecting a suitable crystallographic orientation. As will be demonstrated below, with the piezoelectric material constants it is possible to calculate the orientation in relation to the crystallographic axes with which a transducer element must be cut if the temperature-dependence of its transverse or shear sensitivity is to coincide optimally with ideal behavior, freely selectable within certain limits.

Consequently, the present invention enables piezoelectric measuring transducers to be constructed with virtually a constant sensitivity over a very wide temperature range, without incorporating any temperature sensors in the measuring cell and without complicating the evaluation electronics. This improvement enhances the effective measuring precision decisively, as well as the functional reliability. Moreover, substantial advantages emerge with regard to manufacture and stocking, because, apart from the transducer crystals, all components of the measuring cells do not vary with the amount of temperture compensation.

To aid in understanding the present invention, fundamental differences between oscillator quartzes and transducer quartzes will be explained. Oscillator quartzes are electromechanical resonators, in other words, components serving to constantly maintain an exactly defined oscillation frequency, which is a function of the mechanical dimensions, density and elastic material constants. Temperature-compensated oscillating quartz sections have been known for some time. Their orientation is accordingly chosen so that influences of the temperature-dependence of the elastic constants and of the thermal expansion on the oscillation frequency cancel each other. On the other hand the temperature dependence of piezoelectric coefficients is of negligible importance in resonators, since they are of only subordinate consequence as drive constants. With transducer crystals, however, the situation is reversed. These devices serve to convert mostly aperiodic mechanical signals into electrical signals and are generally operated far below their resonant frequencies. In this range their temperature-dependence is relatively unimportant. Of critical importance for the transducer sensitivity, on the other hand, are the piezoelectric coefficients, whose dependence on temperature is compensated by this invention.

For a more complete understanding of the present invention, attention is directed to the accompanying drawings (and description thereof) wherein:

FIG. 10 shows the temperature-dependence of the piezoelectric coefficient $-d'_{26}$ for the antiaxial shear sensitivity of quartz elements rotated about the X - axis by various orientation angles $\alpha$.

The basis on which the invention is founded may be summarized as follows. The general equation of state for the direct piezoelectric effect is:

$$D_l = \sum_{\mu=1}^{6} (d_{l\mu} \cdot T_\mu) + \sum_{m=1}^{3} (\epsilon_{lm} \cdot E_m) \quad (1)$$

in which,

D=dielectric displacement (charge per unit area)
d=piezoelectric coefficient
$\epsilon$=dielectric constant
E=electric field strength
T=mechanical stress (force per unit area)

The indices l and m denote the direction components of dielectric displacement and field strength, respectively related to the orthogonal crystal coordinates, from 1 to 3, corresponding to the axes X, Y, Z. The components of the elastic stress tensor are denoted analogously with the reduced indices $\mu$. As usual $T_1$, $T_2$, $T_3$ denote pressures parallel to, and $T_4$, $T_5$, $T_6$ shear stresses about the axes X, Y, Z.

Thus, the piezoelectric coefficient $d_{l\mu}$ constitutes a tensor of the third order, which comprises 18 elements in the general case. If the auxiliary axes X, Y, Z, adopted as basic axes, coincide with elements of symmetry of the crystal, some tensor elements will be equal to 0 or mutually interdependent.

Figure 1:
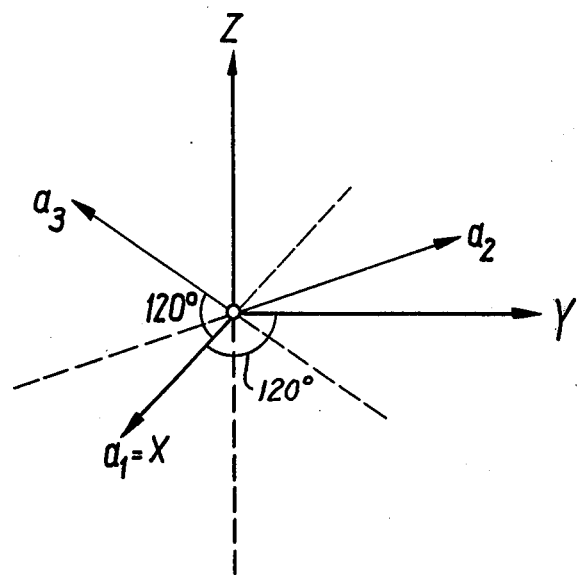
FIG. 1 shows the arrangement of Cartesian coordinates X, Y, Z in relation to crystal axes $a_1$, $a_2$, $a_3$ and c.

The present invention is concerned with crystals of the symmetry class 32, i.e., with crystals of the trigonal-trapezohedral class for which the orthogonal auxiliary coordinate system is defined as having the Z axis coinciding with the trigonal covering axis of rotation c and the X axis with the binary 'a' axis. The Y axis if fixed as normal to the XZ plane, so that a left-hand system of Cartesian coordinates results for lef-handed crystals and a right-hand one for right-hand crystals, cf. FIG. 1. With the crystal types preferred here, the contribution of the field strength vector to the dielectric displacement is practically negligible compared with the influence of the elastic stress tensor. Hence, only the latter will be taken into account in the following.

Thus, the above relation (1) for the direct piezoelectric effect of a crystal of the symmetry described may be expressed in matrix form as follows:

$$\begin{pmatrix} D_1 \\ D_2 \\ D_3 \end{pmatrix} = \begin{pmatrix} d_{11} & d_{12} & 0 & d_{14} & 0 & 0 \\ 0 & 0 & 0 & 0 & d_{25} & d_{26} \\ 0 & 0 & 0 & 0 & 0 & 0 \end{pmatrix} \times \begin{pmatrix} T_1 \\ T_2 \\ T_3 \\ T_4 \\ T_5 \\ T_6 \end{pmatrix} \quad (2)$$

whereby, in addition: $d_{12} = -d_{11}$
$d_{25} = -d_{14}$
$d_{26} = -2d_{11}$

The piezoelectric d tensor thus contains only two independent elements, $d_{11}$ and $d_{14}$. Their magnitude and temperature-dependence differ generally, and are governed by the composition and fine structure of the crystal in question. Consequently, a piezoelectric transducer element whose sensitivity is to respond differently to temperature than the material constants $d_{11}$ and $d_{14}$ calls for an orientation in which the sensitivity is a function of both material constants. To obtain a complete picture of all possible orientations imaginable it is sufficient to state the formula for one tensor element to each of the four types of piezoelectric interaction.

Figure 2:
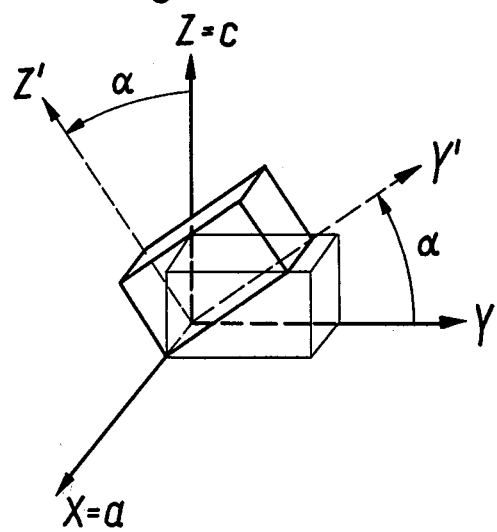
FIG. 2 shows the orientation of a piezoelectric crystal element in relation to the coordinate axes with a rotation $\alpha$ about the X axis.
Figure 3:
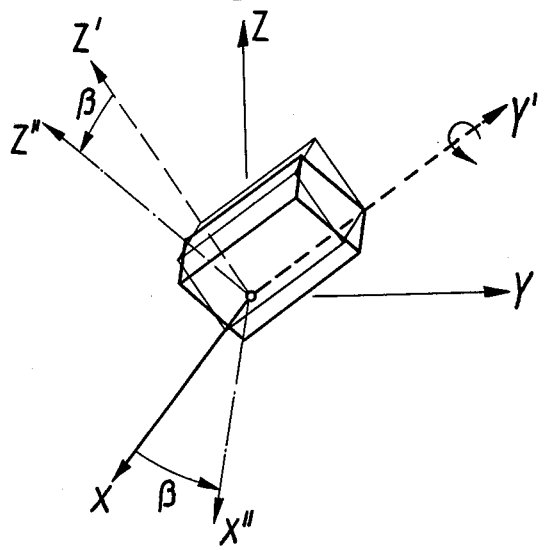
FIG. 3 illustrates a twofold rotation, first about the X axis and then about the Y' axis.
Figure 4:
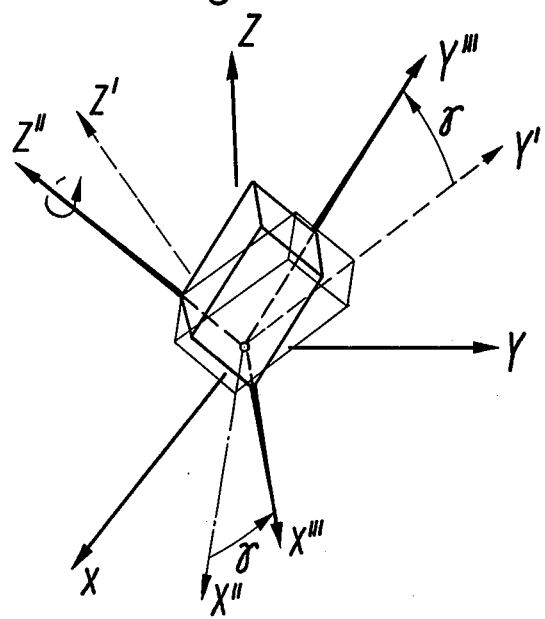
FIG. 4 illustrates a threefold rotation, first about the X axis, then about the Y' axis and finally the Z" axis.

If the position of the crystal element in relation to the coordinate axis is described according to Gauss, by successive rotations about axes at right angles to each other, then two rotations are needed for the six matrix elements with $l=\mu$ (longitudinal effects) or $l=(\mu-3)$ (synaxial shear effects), and three rotations for the other 12 elements. The first rotation is performed about the X axis by the angle $\alpha$ (FIG. 2). The second rotation by the angle $\beta$ takes place about the Y' axis which emerges from the first rotation (FIG. 3). The third rotation by the angle $\gamma$ is performed about the doubly transformed axis Z" (FIG. 4). The formulas that follow may be derived from the unreduced d matrix, (generally 27 elements with three-digit indices) by multiplying with the known transformation matrices after taking the crystal symmetry into account, and then reducing to two-digit indices.

For the longitudinal piezoelectric effect we have:

$$d''_{11} = d_{11} \cdot [\cos^2\beta - 3\sin^2\alpha \cdot \sin^2\beta] \cdot \cos\beta \ldots \quad (3)$$

In this equation $d_{14}$ does not occur, which means that it is not possible to produce a longitudinal piezoelectric transducer element from a crystal of symmetry 32 having a temperature response deviating from that of the known X section. The synaxial shear sensitivity can likewise be represented as an indicatrix with two rotations:

$$d'''_{14} = 2d_{11} \cos\alpha \sin\alpha(\cos^2\beta - \sin^2\beta) + d_{14}[(\cos^2\alpha - \sin^2\alpha)\cos\beta - \sin^2\alpha\sin^2\beta] \ldots \quad (4)$$

The temperature coefficient depends on both angles of rotation. The formulas for the transverse effect $d'''_{12}$ and for the antiaxial shear effect $d'''_{26}$ with any orientation are:

$$d'''_{12} = (d_{14}\cos\alpha\sin\alpha - d_{11}\cos^2\alpha)\cdot\cos\beta\cos^3\gamma \\
+ (4d_{11}\cos\alpha\sin\alpha + d_{14}\cos^2\alpha)\cos\beta\sin\beta\cos^2\gamma \\
\sin\gamma + [d_{11}(2\cos^2\alpha + \cos^2\beta - 3\sin^2\alpha\sin^2\beta) + + d_{14} \\
\cos\alpha\sin\alpha]\cos\beta\cos\gamma\sin^2\gamma + (d_{14}\cos^2\alpha - 2d_{11} \\
\cos\alpha\sin\alpha)\cos\beta\sin\beta\sin\gamma\ldots \quad (5)$$

$$d'''_{26} = 12d_{11}\cos\alpha\sin\alpha\cos\beta\sin\beta\cos^2\gamma\sin\gamma + 2 \\
d_{11}[3(\cos^2\alpha - \sin^2\alpha) + + (1 + 3\sin^2\alpha)\cos^2\beta]\cos\beta \\
\cos\gamma\sin^2\gamma - (2d_{11}\cos\alpha + d_{14}\sin\alpha\cos\alpha\cos\beta\cos \\
\gamma - (4d_{11}\sin\alpha + d_{14}\cos\alpha\cos\beta\sin\gamma\ldots \quad (6)$$

With these formulas the magnitude of the piezoelectric coefficients and their temperature coefficient may be chosen freely, within the given variation range. A degree of freedom still remains allowing the secondary sensitivities to be minimized within certain limits.

In general, crystal sections rotated threefold involve some difficulties in practical use, such as manufacturing complications. More serious is the fact that with such crystal elements of general orientation, all 18 matrix elements differ from 0; this may lead to sensitivity to lateral forces and acceleration which is difficult to compensate. On account of this, the use of monoaxially rotated sections is recommended from the outset where these are able to satisfy the requirements involved. From the last two formulas it is possible to derive the expressions for orientations limited to one or two rotations. Where rotation takes place only about the X and Y' axes we obtain:

$$d''_{12} = (d_{14}\sin\alpha - d_{11}\cos\alpha)\cos\alpha\cos\beta \ldots \quad (7)$$

$$d''_{26} = -(2d_{11}\cos\alpha + d_{14}\sin\alpha)\cos\alpha\cos\beta \ldots \quad (8)$$

Obviously, in contrast to rotation about the X axis, rotation about the Y' axis brings no alteration in the temperature-dependence of the piezoelectric coefficients for the transverse and antiaxial effects, but only an overall reduction in the sensitivity - which is normally undesirable.

By analogy, where there is a first rotation about the X axis and a second one about the transformed Z' axis we obtain the following:

$$d''_{12} = [d_{11}(1 + 2\cos^2\alpha) + d_{14}\cos\alpha\sin\alpha]\cos \\
\gamma - d_{11}(1 + 3\cos^2\alpha)\cos^3\gamma\ldots \quad (9)$$

$$d''_{26} = -[2d_{11}(1 + 2\cos^2\alpha) + d_{14}\cos\alpha\sin\alpha]\cos \\
\gamma - 2d_{11}(1 + 3\cos^2\alpha)\cdot\cos^3\gamma\ldots \quad (10)$$

In this case $\alpha$ and $\gamma$ are no longer independent, but it is easy to show that here too, a rotation about the Z' axis leads to a loss of sensitivity compared with a monoaxially rotated section with the same relative temperature response. For the third special case, with the first rotation about Y and the second about Z', the following may be derived:

$$d''_{12} = d_{11}\cdot[(2 + \cos^2\beta) - (3 + \cos^2\beta)\cos^2\gamma]\cos\beta\cos \\
\gamma + d_{14}\cdot\cos\beta\sin\beta\sin\gamma \ldots \text{tm} \quad (11)$$

$$d''_{26} = 2d_{11}\cdot[(2 + \cos^2\beta) - (3 + \cos^2\beta)\cos^2\gamma]\cos\beta\cos \\
\gamma - d_{14}\cdot\cos\beta\sin\beta\sin\gamma \ldots \quad (12)$$

Here the sine factors reduce the influence of $d_{14}$ if the angle of rotation is small, while, if it is increased, the overall sensitivity diminishes rapidly, so that this type of section is usually less favorable for measuring applications than that rotated about the X axis.

Thus, the foregoing considerations lead to the important conclusion that of all the section orientations with a constant ratio of the $d_{11}$ and $d_{14}$ increments for one of the tensor elements representing transverse or antiaxial shear effects, those orientations derived solely by rotation about the X axis yield the greatest absolute value for the piezoelectric coefficient. On account of the many potential applications the transformed matrix of these purely X-rotated sections may be explained more fully:

$$\begin{pmatrix} d'_{11} & d'_{12} & d'_{13} & d'_{14} & 0 & 0 \\ 0 & 0 & 0 & 0 & d'_{25} & d'_{26} \\ 0 & 0 & 0 & 0 & d'_{35} & d'_{36} \end{pmatrix} \quad (13)$$

in which $d'_{11} = d_{11}$ $d'_{12} = -(d_{11}\cos\alpha - d_{14}\sin\alpha)\cos\alpha$ $d'_{13} = -(d_{11}\sin\alpha + d_{14}\cos\alpha)\sin\alpha$ $d'_{14} = +2d_{11}\cos\alpha\cdot\sin\alpha\, 30\, d_{14}(\cos^2\alpha - \sin^2\alpha)$ $d'_{25} = +(2d_{11}\sin\alpha - d_{14}\cos\alpha)\cos\alpha$ $d'_{26} = -(2d_{11}\cos\alpha + d_{14}\sin\alpha)\cos\alpha$ $d'_{35} = -(2d_{11}\sin\alpha - d_{14}\cos\alpha)\sin\alpha$ $d'_{36} = +(2d_{11}\cos\alpha + d_{14}\sin\alpha)\sin\alpha$ The three new elements included in the matrix can be related to the isotypic piezoelectric effects by substituting axes as follows:

$d\,40_{13}(60) = +d'_{12}(60\pm 90°)$ $d'_{35}(60) = +d\,40_{26}(\alpha\pm 90°)$ $d'_{36}(\alpha) = -d'_{25}(\alpha\pm 90°)$ Two more important facts emerge from the matrix presentation. X-rotated crystal elements whose electrodes lie in the Y'Z' plane, i.e., in particular the temperature-compensated transverse transducer elements, are insensitive to antiaxial shear forces since $d'_{15} = d'_{16} = 0$. X-rotated crystal elements whose electrodes lie parallel to the XZ' or XY' plane respond neither to longitudinal nor transverse pressure forces nor to shear forces about the X axis. All these transducer elements are thus insensitive to disturbing lateral forces, just like the familiar X and Y sections. This is decisive for their application in measuring cells of known design.

With the exception of $d'_{11}$, all components of the piezoelectric 'd'' tensor differing from 0 represent linear combinations of $d_{11}$ and $d_{14}$ terms. Accordingly, each of these piezoelectric effects can be made independent of temperature within a certain range by a suitable choice of the orientation angle $\alpha$. However, this aplies solely to crystal elements whose orientation is defined by a rotation about the X axis. With crystal sections rotated about the Y or Z axis, only piezoelectric effects depending on a single coefficient exist. Thus, the temperature-dependence of the sensitivity of these sections cannot be altered with the orientation angle. In the case of exclusively Y-rotated sections, 17 of the 18 matrix elements differ from 0; with Z-rotated sections, 8 elements differ from 0. Consequently, only the X-rotated crystal sections need be further considered.

As an example, if the temperature coefficient of the first order for $d'_{12}$ is to be eliminated, the following conditional equation is obtained for the orientation angle:

$$\frac{\delta d_{14}}{\delta \theta} \cdot \sin \alpha - \frac{\delta d_{11}}{\delta \theta} \cdot \cos \alpha = 0 \quad (14)$$

or $$\alpha = \arctan \left[ \frac{\left(\frac{\delta d_{11}}{\delta \theta}\right)}{\left(\frac{\delta d_{14}}{\delta \theta}\right)} \right] \quad (15)$$

By analogy, for the case $\frac{\delta d'_{26}}{\delta \theta} = 0$ we obtain:

$$\alpha = \arctan \left[ \frac{-2 \cdot \left(\frac{\delta d_{11}}{\delta \theta}\right)}{\left(\frac{\delta d_{14}}{\delta \theta}\right)} \right] \quad (16)$$

Figure 5:
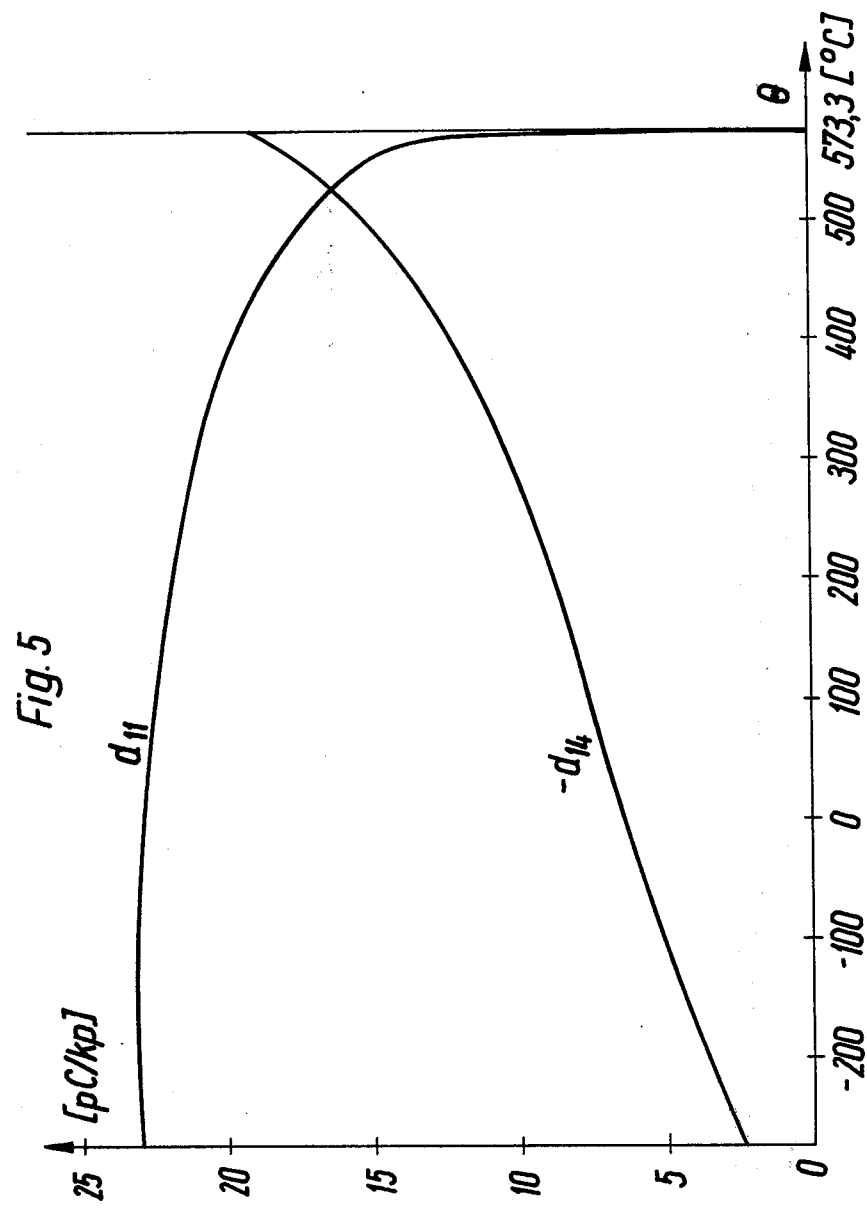
FIG. 5 shows the temperature-dependence of the piezoelectric coefficients $d_{11}$ and $-d_{14}$ of quartz.

As a typical application, a quartz element for transverse pressure conversion may be described. With the data given below it is possible to calculate any other quartz crystal transducer elements in similar fashion. The temperature behavior of the piezoelectric coefficient $d_{11}$ has already been discussed at the outset with reference to FIG. 5. Also plotted in the same diagram is the basically different temperature curve for $d_{14}$, whereas $d_{11}$, after a flat maximum at about $-150°$ C., drops progressively with increasing temperature; $d_{14}$ has the opposite sign and its absolute value is progressively rising. At the high-low quartz transformation point of 573.3° C. where $d_{11}$ disappears, $d_{14}$ attains its maximum.

In order to replace these two curves by mathematical expressions with the highest possible precision, five-term approximation polynomials of the following kind are very convenient:

$$d_{11} = A_o + A_1 \theta 30 \; A_2 \theta^2 30 \; A_3 \theta^3 + A_4 \theta^4 \ldots \quad (17)$$

$$d_{14} = B_o + B_1 \theta + B_2 \theta^2 + B_3 \theta^3 + B_4 \theta^4 \ldots \quad (18)$$

$A_o$ is the value of $d_{11}$ at which the temperature $\theta$ 0° C.

$$A_1 = + \frac{\delta d_{11}}{\delta \theta} - \Theta \frac{\delta^2 d_{11}}{\delta \theta^2} + \frac{\theta^2}{2} \frac{\delta^3 d_{11}}{\delta \theta^3} - \frac{\theta^3}{6} \frac{\delta^4 d_{11}}{\delta \theta^4}$$

$$A_2 = \frac{1}{2} \frac{\delta^2 d_{11}}{\delta \theta^2} - \frac{\theta}{2} \frac{\delta^3 d_{11}}{\delta \theta^3} + \frac{\theta^2}{4} \frac{\delta^4 d_{11}}{\delta \theta^4}$$

$$A_3 = \frac{1}{6} \frac{\delta^3 d_{11}}{\delta \theta^3} - \frac{\theta}{6} \frac{\delta^4 d_{11}}{\delta \theta^4}$$

$$A_4 = \frac{1}{24} \frac{\delta^4 d_{11}}{\delta \theta^4}$$

The same relations exist analogously between the B parameters and the differential quotients of $d_{14}$.

If $\Theta$ is substituted in degrees Celsius, in the temperature range $-150$ to $+150°$ C., $d_{11}$ and $d_{14}$ are best reproduced by the following numerical values:

TABLE 1

| | | |
|---|---|---|
| $A_0 = +2.280 \cdot 10^{+1}$ | $B_0 = -6.433$ | $pC \cdot kp^{-1}$ |
| $A_1 = -4.436 \cdot 10^{-3}$ | $B_1 = -1.242 \; 10^{-2}$ | $pC \cdot kp^{-1} \cdot deg^{-1}$ |
| $A_2 = -9.790 \cdot 10^{-6}$ | $B_2 = +7.232 \cdot 10^{-6}$ | $pC \cdot kp^{-1} \cdot deg^{-2}$ |

TABLE 1-continued

| | | |
|---|---|---|
| $A_3 = +5.551 \cdot 10^{-8}$ | $B_3 = -1.609 \cdot 10^{-8}$ | $pC \cdot kp^{-1} \cdot deg^{-3}$ |
| $A_4 = -1.263 \cdot 10^{-10}$ | $B_4 = -4.053 \cdot 10^{-11}$ | $pC \cdot kp^{-1} \cdot deg^{-5}$ |

Figure 6:
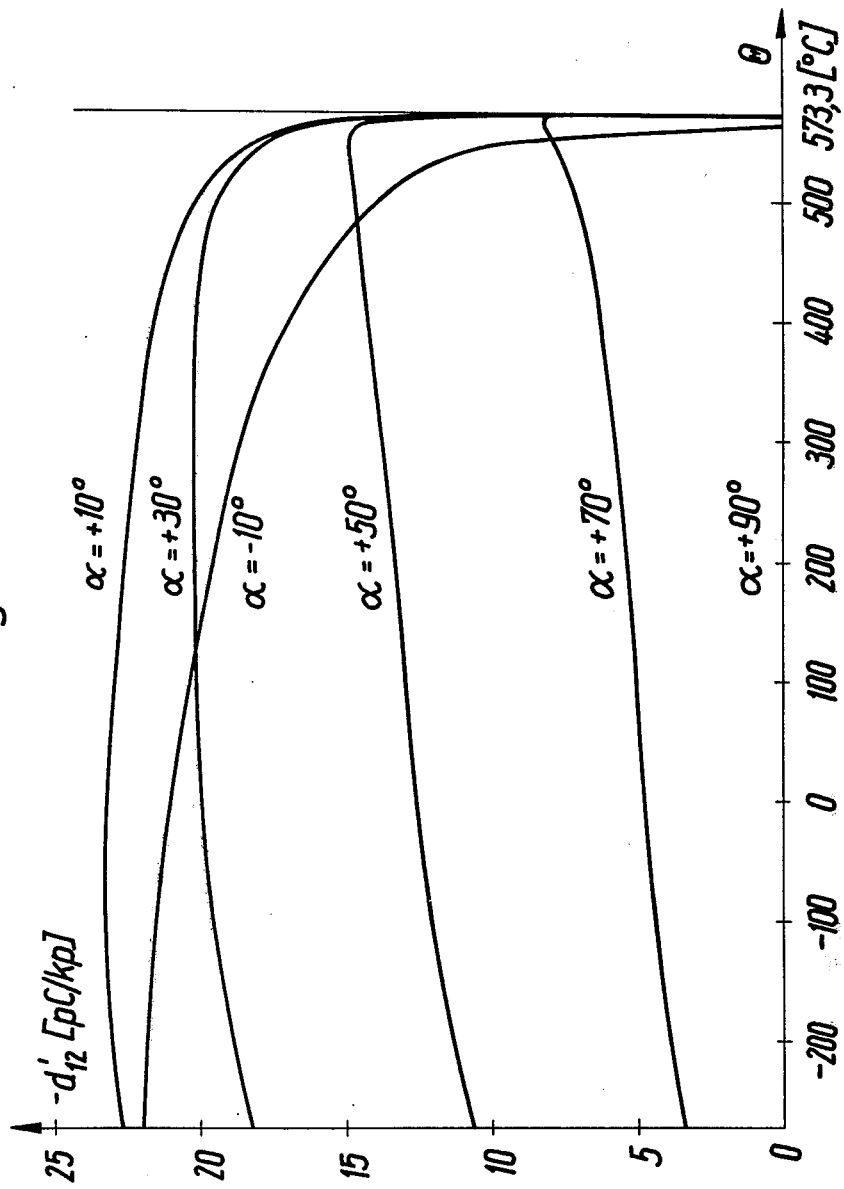
FIG. 6 shows the temperature-dependence of the transformed piezoelectric coefficient $-d'_{12}$ for crystal elements whose cutting directions are rotated about the X-axis by various angles $\alpha$.
Figure 7:
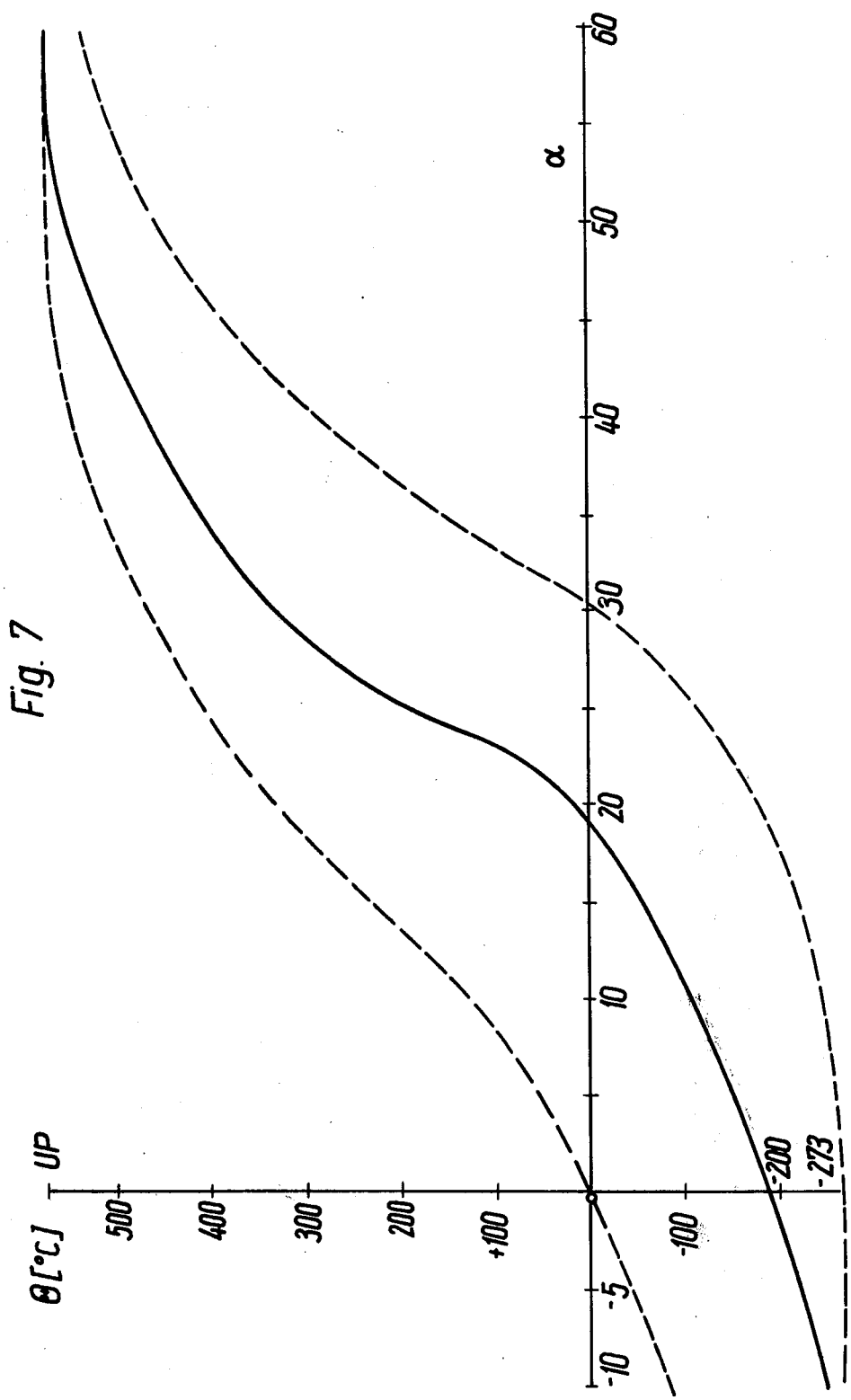
FIG. 7 is a plot of the temperatures at which the transverse sensitivity coefficient $-d'_{12}$ reaches a maximum, versus the orientation angle $\alpha$. Further the temperature limits of a $\pm 1\%$ interval of thermal sensitivity deviation are indicated by dashed lines.

By substituting these polynomials into the transformation equations of the matrix elements, all eight piezoelectric coefficients of a quartz element can be calculated as a function of the temperature for any orientation angle $\alpha$. The results of this calculation are plotted graphically in FIG. 6 for the transverse effect—$d'_{12}$. As the angle $\alpha$ increases, the temperature curves initially become flatter in the range of about $0=$ to about $300=$ C., after which they assume a more convex shape. The maximum sensitivity then shifts to higher temperatures, while at the same time the height of the peak declines monotonically. In FIG. 7 the temperature of this sensitivity maximum for the transverse effect—$d'_{12}$ is plotted in the form of a solid curve as a function of the angle of rotation $\alpha$.

Ideally suited for measuring applications is that quartz section which has a constant and, at the same time, highest possible sensitivity within the accuracy requirements over the widest possible temperature interval. The orientation of this desired section may be ascertained by variation calculus or approximation. If the requirement for constancy of the calibration factor is fixed at $\pm 1\%$, then the upper limit of the piezoelectric sensitivity will be its maximum, while the lower limit will correspond to two real roots, which generally have different intervals from the maximum. These two temperatures are also plotted in FIG. 7, in the form of broken lines.

Figure 8:
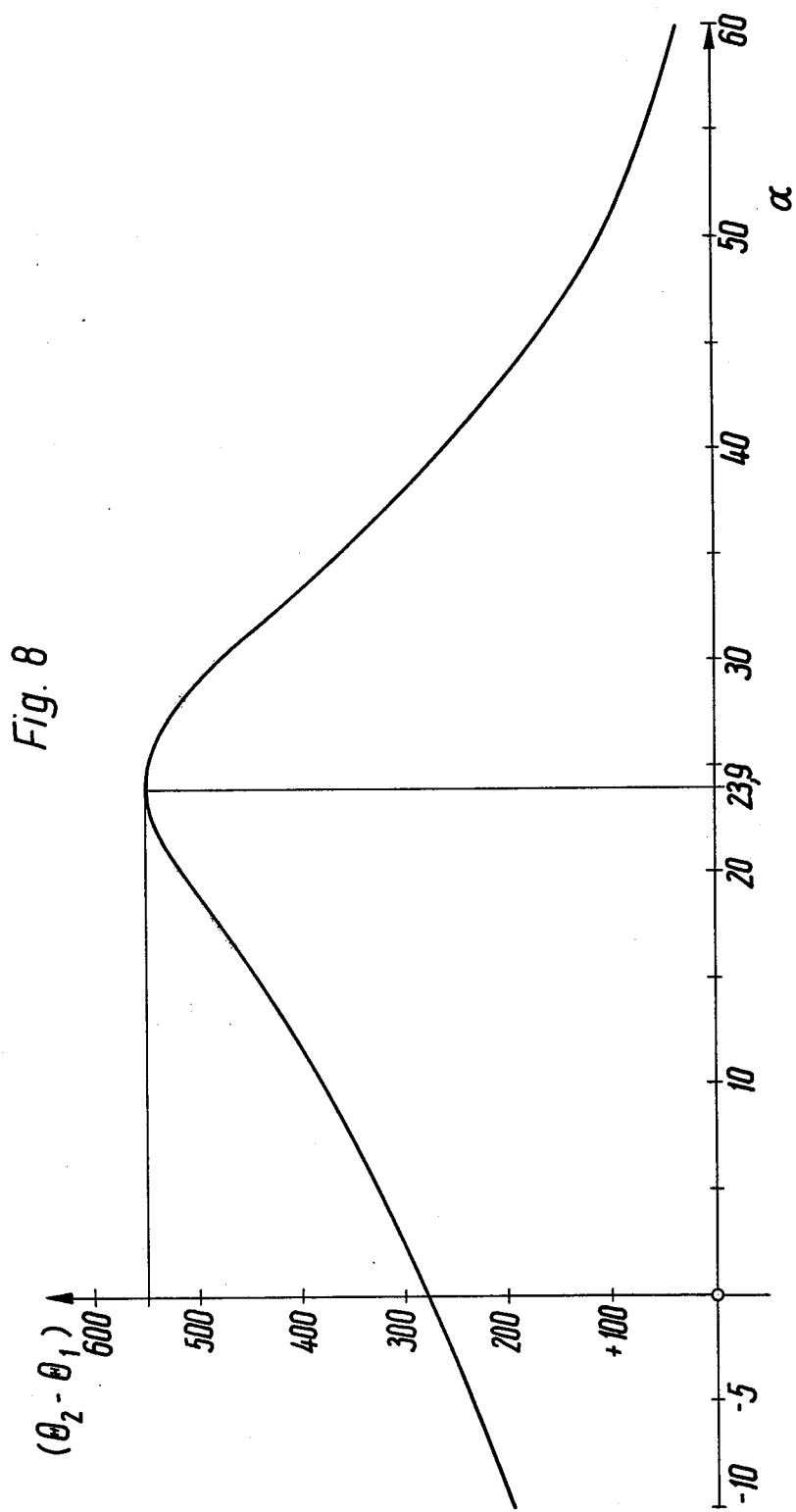
FIG. 8 shows the magnitude of the temperature interval within which the piezoelectric transversal sensitivity of an X-rotated quartz element remains constant to within $\pm 1\%$, as a function of the angle $\alpha$.

The temperature interval within which the piezoelectric sensitivity remains constant within $\pm 1\%$ is equal to the distance between these two curves for every value of the angle of rotation. The magnitude of this temperature interval is shown in FIG. 8 as a function of $\alpha$. From this it follows that the quartz section with the best temperature-independence has an orientation angle of about 23.9°. Its transverse sensitivity is $-21.337$ pC/kg to within $\pm 1\%$ between $-143$ and $+408°$ C., so that the interval amounts to about 550°. If the precision requirement is narrowed to $\pm 0.5\%$, the temperature range becomes approximately $-93$ to $+369°$ C., in other words, substantially 462 degrees.

Figure 9:
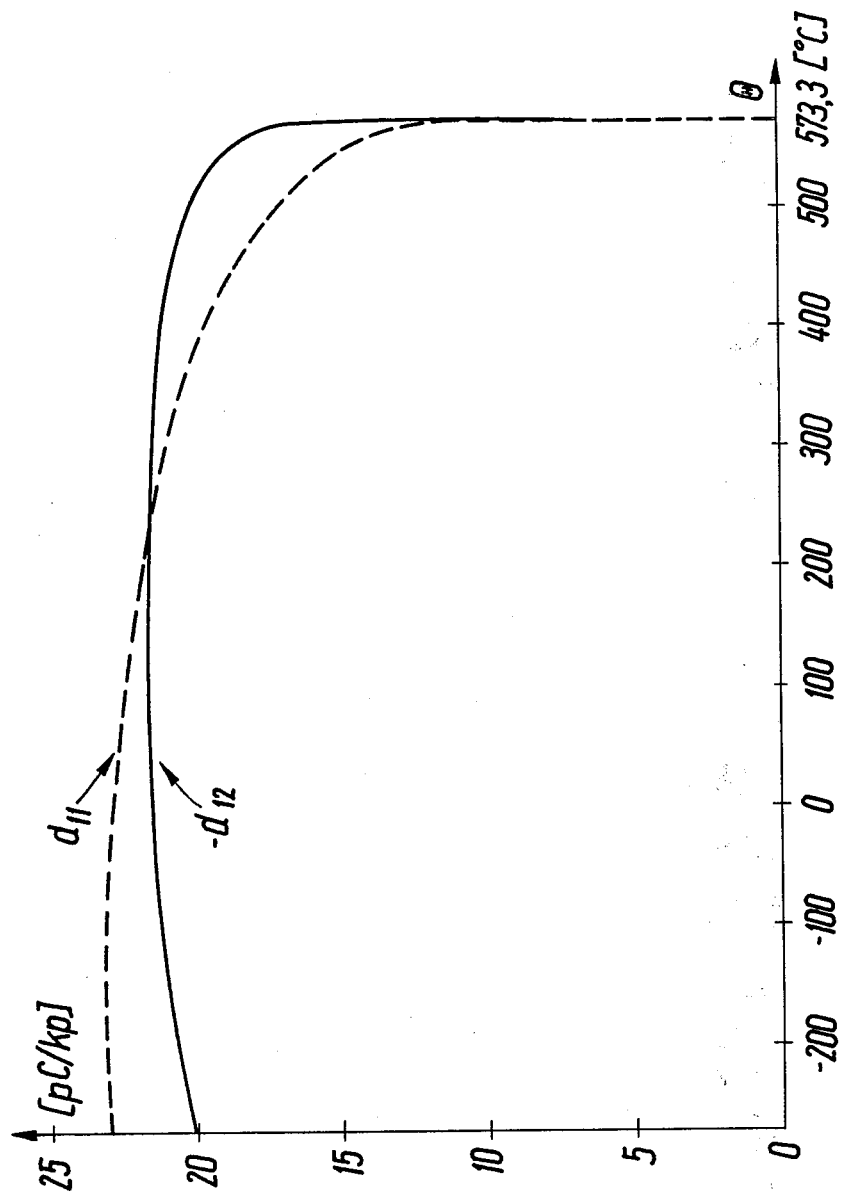
FIG. 9 shows a comparison of the temperature-dependence of the piezoelectric sensitivity $-d'_{12}$ for a section in accordance with the invention, and the sensitivity $d_{11}$ for a usual longitudinal section; &

In the technologically most important temperature range, with this section, the temperature response of the piezoelectric coefficient—$d'_{12}$ is practically no longer measurable, since it deviates by only $\pm 1\%$ from the value of $-21.423$ pC/kg between approximately $-10$ and $\pm 294°$ C. The complete temperature curve for this transverse section is plotted in FIG. 9, together with the associated longitudinal sensitivity $d_{11}$, whose curve corresponds to that of the usual quartz sections. It will be seen from the diagram that the piezoelectric coefficient—$d'_{12}$ of the section in accordance with the invention is only slightly smaller than the familiar X section below approximately 240° C. Above 240° C. the sensitivity of the proposed section is even better than that of the X section. Another favorable point is that at the high-low transformation point of quartz (573.3° C.) the piezoelectric effect of the new section does not vanish as with the known sections, but still amounts to 6.88 pC/kp.

In addition to the improvements described above, the choice of section orientation according to the invention brings a further decisive gain. If a quartz element with an orientation angle close to the value stated is preloaded in the direction of its transformed Y' axis, this causes a reduction of the free enthalpy of the crystal lattice and a commensurate rise in the energy level for the twinning lattice state in accordance with the so-called Dauphine law. This can be proved thermodynamically by the tensor-based directional dependence of the elasticity coefficients of quartz. Thus an energetic instability for twin domains results and, consequently, a greatly reduced proneness to twinning. This makes it possible to employ quartz elements conforming to the invention at temperatures where all conventional quartz transducers would become unserviceable in a short time.

The quartz section described herein represents only an arbitrarily selected example of the application of the invention. With the data given above, other section orientations may be ascertained as required, for transducer quartzes to be employed at particularly high temperatures for instance, or for transducers with 0 temperature coefficient at room temperature instead of around 140° C. etc. Also, quartz elements for converting antiaxial shear forces may be calculated analogously, by starting from the equations for $d'_{26}$, instead of $d'_{12}$. The temperature curve of this piezoelectric coefficent $d'_{26}$ is plotted in FIG. 10 for different values of the orientation angle $\alpha$. It will be seen that, in this case, a reduction of the temperature coefficients calls for a rotation in the opposite direction to that for the transverse piezoelectric coefficient $d'_{12}$, and that the associated reduction in the mean sensitivity is much more pronounced. For most practical purposes it will, therefore, be best to compromise between sensitivity and independence of temperature. Depending on the operating temperature, orientations between about 120° and about 160° will generally be particularly suitable. Of course, these sections may be calculated by the other methods described as well; further details on this are superfluous and can be readily calculated by one skilled in the art from the above discussion.

It should also be pointed out that the piezoelectric sensitivity of a complete transducer generally does not yield exactly the same temperature-dependence as that of the crystal element per se. This circumstance results primarily from the division of the forces acting on the measuring cell between the crystal elements on the one hand and preloading device on the other. When the temperature changes, these two parts expand by different amounts depending on their dimensions and coefficients of expansion. In this way, the load distribution between crystal elements and a preloading device is altered. A difference in the temperature-dependence of the respective coefficients of elasticity also contributes to this Moreover, other effects like the temperature-dependence of the dielectric constants etc. may exercise an influence. For accurate predictions, however, at least the piezoelectric and elastic constants with their temperature coefficients, the coefficients of thermal expansion and the geometrical dimensions of the components must be taken into account.

From this it follows that the temperature-dependence of the piezoelectric sensitivity of a transducer can be modified within certain limits by the dimensioning and choice of material constants, that is, irrespective of the crystal orientation. But the effects generally mentioned have relatively little influence, compared with the crystal orientation. Depending on the dimensions it may even disappear altogether, as has been assumed in the typical application illustrated.

Applications for piezoelectric transducers may also be imagined calling for designs with two differently oriented types of crystal elements. These include, for example, acceleration-compensated pressure and force measuring cells, in which the compensating elements must have only a fraction, such as a third of the sensitivity of the main elements but otherwise the same relative temperature-dependence. In such cases the use of twofold rotated crystal elements is generally preferably to crystal forms with partly short-circuited electrode areas. According to requirements of lateral sensitivity and other effects, the orientation may be chosen in a different way. In the case of transverse transducers, for example, it may be convenient to perform a first rotation about the Y or Z axis as the case may be, followed by a second rotation about the transformed X' axis.

Finally it should be emphasized that the invention is not confined to quartz crystals but may be applied analogously to other materials of the crystal class 32 as well. At the present time, however, not many crystals of this symmetry are known which can also be grown easily in large species and which fulfill the exacting requirements in the way of mechanical, piezoelectric and electrical properties. For applications at particularly high temperatures and other extreme conditions, the trigonal phases of germanium dioxide $GeO_2$ and aluminum phosphate $AlPO_4$, for example, offer certain possibilities.

I claim:

1. A piezoelectric crystal element for use in force and pressure transducers and accelerometers converting forces, pressures, torques and accelerations into electrical signals such that the temperature dependence of at least one of the transverse and antiaxial shear sensitivity coefficients is considerably reduced over a predetermined temperature interval, as compared to the longitudinal piezoelectric coefficient, said element comprising a member of monocrystalline material of symmetry class 32, having two force introduction surfaces essentially parallel to a crystallographic 'a'-axis but inclined with respect to the 'c'-axis so as to intersect the latter at an orientation angle $$\alpha = \arctan\left[\frac{f \cdot \left(\frac{\delta d_{11}}{\delta \theta}\right)}{\left(\frac{\delta d_{14}}{\delta \theta}\right)}\right]; \quad -63° \text{ C.} \leq \theta \leq +450° \text{ C.}$$

wherein $d_{11}$ and $d_{14}$ are the independent coefficients of the piezoelectric d-tensor, and '$\theta$' represents the temperature at which said crystal element is required to yield a maximum value of piezoelectric sensitivity and a zero temperature coefficient of sensitivity, and wherein 'f' is a constant having a value of $+1$ for the transverse piezolectric effect and a value of $-2$ for the antiaxial shear piezoeffect.

2. A piezoelectric crystal element according to claim 1, wherein said monocrystalline material is quartz, and wherein the transverse piezoelectric sensitivity has a maximum value with a zero temperature coefficient at a temperature specified within the range from about $-63°$ C. to about $+450°$ C., from which results an orientation angle $\alpha$ having a value between about 10 and about 40°.

3. A piezoelectric crystal element according to claim 1, wherein said monocrystalline material is quartz and wherein the antiaxial shear sensitivity has a maximum value with a substantially zero temperature coefficient at a temperature within the range from about −63° C. to about +450° C., from which results an orientation angle α having a value of between about 120 and about 160 degrees.

4. A piezoelectric crystal element for use in force and pressure transducers and accelerometers converting forces, pressures, torques and accelerations into electrical signals, comprising a member of monocrystalline material, the symmetry of which corresponds to that of the piezolectric d coefficient tensor of the point group 32, and wherein two parallel force introduction surfaces are essentially parallel to a crystallographic 'a' axis and are inclined with respect to the 'c' axis, so that the temperature dependence of the piezoelectric sensitivity for one of (i) transverse and (ii) shear effect is considerably reduced over a predetermined temperature interval, as compared to the longitudinal piezoelectric coefficient, characterized in that the surfaces of the crystal at which forces are introduced have an orientation angle α(i) either of from about 10° to about 40° with respect to the 'c'-axis, and its complement, whereby the temperature dependence of at least one of the piezoelectric coefficients d′$_{12}$ and d′$_{13}$, respectively, is minimized over a temperature interval in the range from about −143° C. to about +408° C., or (ii) from about 120° to about 160° with respect to the 'c'-axis, and its complement, whereby the temperature dependence of at least one of the piezoelectric coefficients d′$_{26}$ and d′$_{35}$, respectively, is minimized over a temperature interval in the range from about −200° C. to about +400° C.

5. A piezoelectric crystal element for use in force and pressure transducers and accelerometers coverting forces, pressures, torqued and accelerations into electrical signals such that the temperature dependence of at least one of the transverse and antiaxial shear sensitivity coefficients is considerably reduced over a predetermined temperature interval, as compared to the longitudinal piezoelectric coefficient, said element comprising a member of monocrystalline material of symmetry class 32, having two force introduction surfaces essentially parallel to a crystallographic 'a'-axis but inclined with respect to the 'c'-axis so as to intersect the latter at an orientation angle $$\alpha = \arctan\left[\frac{f \cdot \left(\frac{\delta d_{14}}{\delta \theta}\right)}{\left(\frac{\delta d_{14}}{\delta \theta}\right)}\right]; \quad -200° \text{ C.} \leq \theta \leq +408° \text{ C.}$$

wherein d$_{11}$ and d$_{14}$ are the independent coefficients of the piezoelectric d-tensor, and 'θ' represents the temperature at which said crystal element is required to yield a maximum value of piezoelectric sensitivity and a substantially zero temperature coefficient of sensitivity, and wherein 'f' is a constant having a value of +1 for the transverse piezoelectric effect and a value of −2 for the antiaxial shear piezoeffect.

6. A piezoelectric crystal element according to claim 5, wherein said angle α, at which said two force introduction surfaces intersect said crystallographic 'c' axis if from about 10° to about 40° such that the temperature dependence of the piezoelectric d-tensor coefficient d′$_{12}$ for the transverse piezoelectric sensitivity is minimized over said predetermined temperature interval ranging from about −143° C. to about +408° C.

7. A piezoelectric crystal element according to claim 6, wherein said angle α is 23.9° such that the transverse piezoelectric sensitivity is constant to within about ± 1% over said temperature interval of about −143° C. to about +408° C.

8. A piezoelectric crystal element according to claim 7, wherein said transverse piezoelectric sensitivity is constant to within ± 0.5% over a temperature interval of from about −93° C. to about ±369° C.

9. A piezoelectric crystal element according to claim 8, wherein said transverse piezoelectric sensitivity is constant to within ± 0.1% over a temperature interval of from about −10° C. to about +294° C.

10. A piezoelectric crystal element according to claim 5, comprising a member of monocrystalline quartz wherein two force introduction surfaces are essentially parallel to a crystallograhic 'a'-axis and are inclined with respect to the 'c'-axis so that the temperature dependence of the piezoelectric sensitivity for one of (i) transverse and (ii) shear effect is considerably reduced over a predetermined temperature interval, as compared to the longitudinal piezolectric coefficient, characterized in that the surfaces of the crystal at which forces are introduced have an orientation angle α either (i) of from about 10° to about 40° with respect to the 'c'-axis, and its complement, whereby the temperature dependence of at least one of the piezoelectric coefficients d′$_{12}$ and d′$_{13}$, respectively, is minimized over a temperature interval in the range from about −143° C. to about 30 408° C., or (ii) of from about 110° to about 155° with respect to the 'c'-axis, and its complement, whereby the temperature dependence of at least one of the piezoelectric coefficients d′$_{26}$ and d′$_{35}$, respectively, is minimized over a temperature interval in the range of from about −200° C. to about +400 ° C.

* * * * *